(12) United States Patent
Rehnelt

(10) Patent No.: US 6,232,868 B1
(45) Date of Patent: May 15, 2001

(54) HYBRID CIRCUIT ARRANGEMENT WITH OVERLOAD PROTECTION

(75) Inventor: Karl Rehnelt, München (DE)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 09/462,051
(22) PCT Filed: May 29, 1998
(86) PCT No.: PCT/DE98/01477
§ 371 Date: Dec. 30, 1999
§ 102(e) Date: Dec. 30, 1999
(87) PCT Pub. No.: WO99/01875
PCT Pub. Date: Jan. 14, 1999

(30) Foreign Application Priority Data

Jul. 1, 1997 (DE) .............................................. 197 28 015

(51) Int. Cl.⁷ ....................................................... H01C 7/13
(52) U.S. Cl. ....................... 338/22 R; 338/320; 338/195; 338/23; 338/48
(58) Field of Search .................................. 338/22 R, 23, 338/24, 48, 195, 220, 260, 295, 319, 320

(56) References Cited

U.S. PATENT DOCUMENTS

| | | |
|---|---|---|
| 4,041,440 | 8/1977 | Davis et al. . |
| 4,222,024 * | 9/1980 | Ekowicki ............................ 338/22 R |
| 4,467,310 | 8/1984 | Jakab . |
| 5,166,658 * | 11/1992 | Fang et al. ............................. 338/23 |
| 5,351,026 * | 9/1994 | Kanbara et al. .................... 338/22 R |
| 5,436,609 * | 7/1995 | Chan et al. ......................... 338/22 R |
| 5,594,407 * | 1/1997 | Caddock, Jr. ......................... 338/24 |
| 5,726,623 * | 3/1998 | Camp .................................. 338/22 R |
| 6,020,809 * | 2/2000 | Miyazaki et al. ................... 338/22 R |

FOREIGN PATENT DOCUMENTS

| | | |
|---|---|---|
| 1 253 332 | 11/1967 | (DE) . |
| 82 13 333 U | 8/1982 | (DE) . |
| 41 43 095 | 4/1993 | (DE) . |
| 93 19 473 U | 8/1994 | (DE) . |
| WO 89/03162 | 4/1989 | (WO) . |

* cited by examiner

Primary Examiner—Karl D. Easthom
(74) Attorney, Agent, or Firm—Schiff Hardin & Waite

(57) ABSTRACT

Hybrid circuit arrangement having a resistance layer applied at least on one side of a plate-shaped substrate of glass or ceramic and having at least one overload protection arranged on the substrate that is electrically connected to the resistance layer, whereby the protection is formed by a PTC resistor. As a result thereof, the hybrid circuit arrangement is re-employable with the self-restoring fuse even after an overload malfunction.

1 Claim, 2 Drawing Sheets

HYBRID CIRCUIT ARRANGEMENT WITH OVERLOAD PROTECTION

BACKGROUND OF THE INVENTION

The invention is directed to a hybrid circuit arrangement having a resistance layer applied on at least one side of a plate-shaped substrate of glass or ceramic, and having at least one overload protection arranged on the substrate that is electrically connected to the resistance layer.

Such a hybrid circuit arrangement is known, for example, from German Utility Model DE 93 19 473. Such hybrid circuits with film resistors are particularly utilized as a drop resistor or, respectively, feed resister networks in telecommunication systems and are usually manufactured in thick-film or thin-film technology. Since architectures on an integrated circuit basis have replaced the traditional architectures on the basis of transformers in the meantime, such telephone systems are currently more sensitive than ever to over-voltage and over-current risks in telephone lines. These overload risks can have many different causes, for example lightening strikes, surge voltages induced by neighboring high-tension lines or a direct coupling to high-tension lines.

As disclosed in the aforementioned utility model, thermal fuses are utilized as protection against excessively high long-duration loads, these being fastened such that the dissipated power occurring in case of overload leads to a melting of a solder location at which, for example, a spring clip of the fuse is soldered fast, so that the spring clip soldered fast with prestress snaps away and, thus, interrupts the circuit. Such thermal fuses are in fact cost-beneficial; however, a replacement of the entire hybrid circuit is necessary after a response of the fuses. In regions wherein more outages occur due to a relatively poor infrastructure of the energy and communication networks, an outlay that can no longer be justified quickly results.

SUMMARY OF THE INVENTION

An object of the present invention is thus to create hybrid circuits of the species initially cited with a protection system that is less involved even under the conditions of a relatively high overload rate and, potentially, under other specific conditions prescribed by the employment in telecommunication networks.

Given a hybrid circuit of the species initially cited, this is inventively achieved in that the fuse is formed by a PTC resistor (positive temperature coefficient resistor).

PTC resistors are non-linear resistors (ceramic semiconductors having an extremely high positive temperature coefficient (PTC). Externally or intrinsically heated PTC resistors are utilized for certain switching and regulating jobs. Due to their electrical and mechanical properties and their tolerances, however, they cannot be universally utilized. Inventively, PTC resistors are utilized in the initially cited hybrid circuit arrangement as resettable protection elements in order to enhance the safety and dependability of the systems into which the hybrid circuits are integrated and in order to lower the maintenance costs. When an overload error occurs, the resistance of the PTC resistor rises very rapidly from a basis of, for example, 25Ω, i.e. within a few seconds, to a significantly higher resistance that isolates the fault. After the elimination of the fault condition and the over-voltage, the PTC resistor automatically resets itself, and, given a renewed malfunction, can again become high-impedance due to the thermal contact to the loaded film resistors (outside heating) or directly due to its own dissipated power.

For a better understanding of the invention and its developments, exemplary embodiments are described below with reference to the drawings.

DESCRIPTION OF THE PREFERRED EMBODIMENTS

Figure 1:
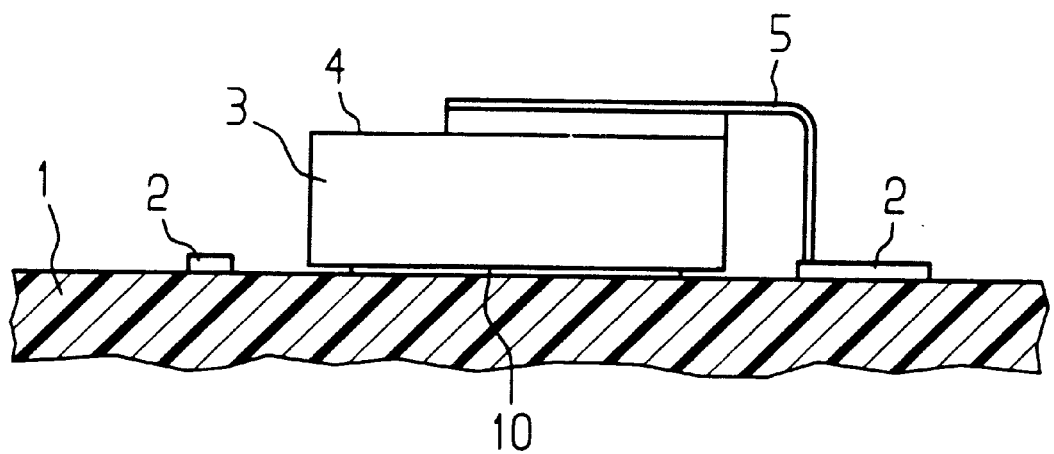
FIGS. 1 and 2 are respective side views of two different embodiments of a PTC resistor arranged on a circuit substrate.

FIG. 1 shows a PTC resistor 3 with a terminal lug 5 preferably provided for a feed resistor network. Such PTC resistors 3 are typically wafer-shaped and comprise a respective contact surface at their two end faces. As shown, the upper contact surface 4 of the PTC resistor 3 is connected via the terminal lug 5 to an interconnect or, respectively, to the resistance layer 2 (see FIG. 3) of the substrate. The diameter of the PTC resistor wafer amounts, for example to 5 mm and its thickness amounts to 2 mm. The lower contact surface of the PTC resistor 3 is directly soldered onto the resistance layer 2, so that the PTC resistor 3 is externally heated by the heating of the substrate 1 occurring in case of an overload. It must be noted that the adhesion of the PTC resistor 3 to the substrate 1 must be assured in all cases of faults, particularly, however, given external heating, since the wafer dare not drop off in any case and move in an uncontrolled fashion in the assembly. Given outside heating, moreover, the PTC resistors 3 must also have a very good coefficient of thermal transmission to the film resistors 2. It is therefore advantageous when the terminal pins 6, 7 or, respectively, 8, 9 of the circuit arrangement—see FIG. 3—and the PTC resistors 3 assume positions on the substrate 1 that lie as far apart as possible. According to FIG. 3, the PTC resistors 3 are placed, for example in the two corners opposite the pin side since the heat elimination via the terminal pins 6, 7, 8, 9 is low at these positions and, thus, a rapid external heating of the PTC resistors 3 by the dissipated power in the resistance layer 2 is assured.

A poor thermal conduction coefficient, moreover, is often caused by voids in the soldered surface 10 between PTC resistor 3 and resistance layer 2. It is therefore advantageous to provide the solder surface 10 between PTC resistor 3 and resistance layer 2 with recesses. For example, a printing mask having star-shaped recesses can be employed. As a result of these recesses in the solder surface 10, the gases arising during the reflow soldering phase can escape, as a result whereof voids in the solder surface 10 are largely avoided.

Figure 2:
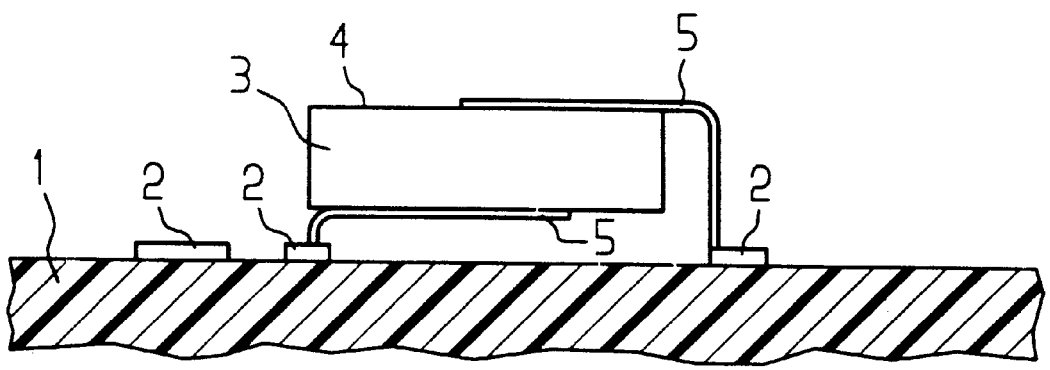

An embodiment of the PTC resistor 3 as a surface-mounted component having two terminal lugs 5 is shown in FIG. 2. The PTC resistor wafer, as can be seen, has not direct thermal contact with the substrate 1, so that the PTC resistor 3—in case of malfunction—becomes high-impedance as a direct result of the overload power flowing through it. The same protective effect as in the case of a thermal fuse is achieved both given an externally as well as given an intrinsically heated PTC resistor 3 but without destroying the resistor network due to the irreversibly triggered thermal fuse.

Figure 3:
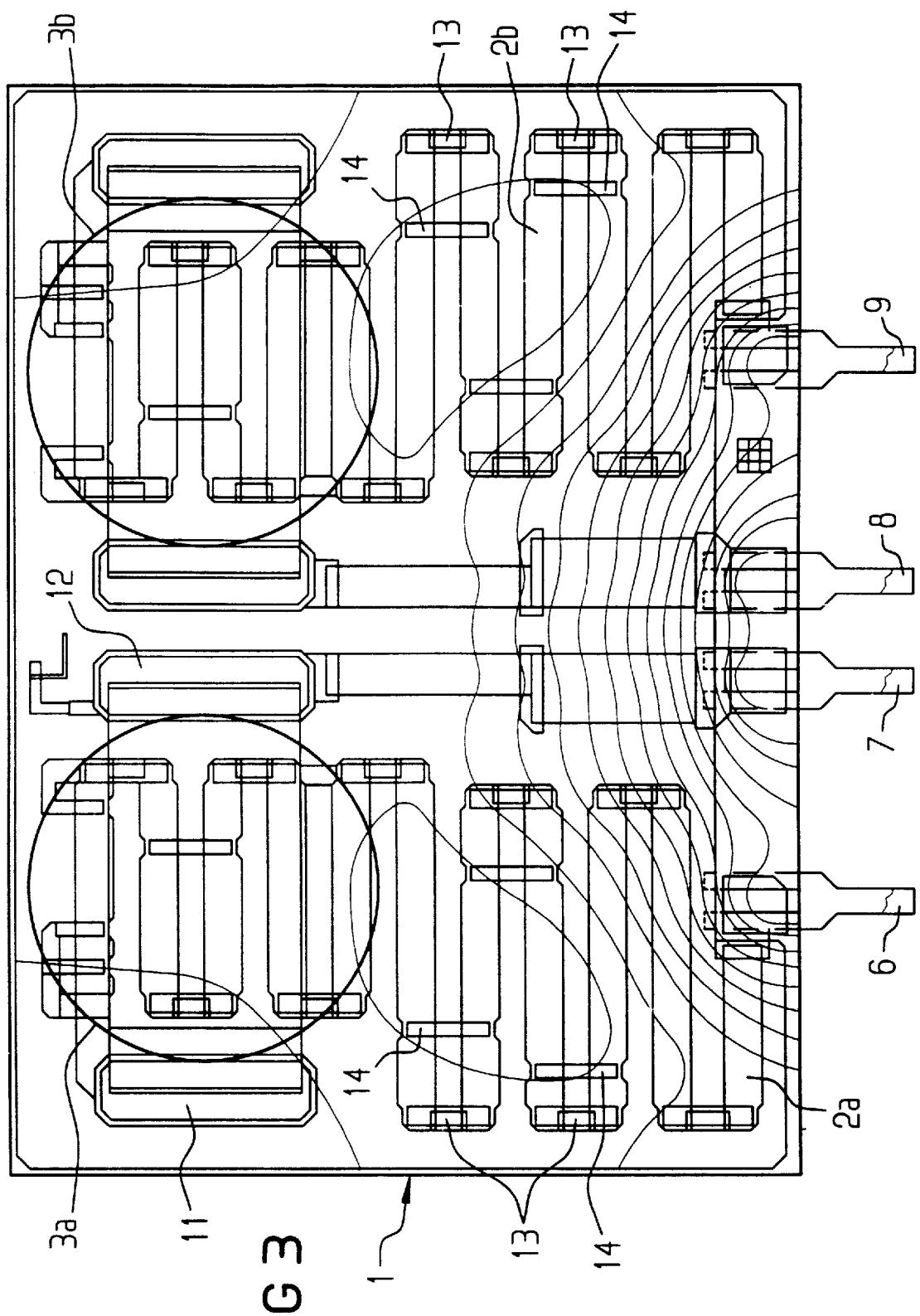
FIG. 3 is a schematic and simplified plan view of a structured resistance layer provided with two PTC resistors.

FIG. 3 shows a resistance layer with two separate current paths 2a and 2b being fashioned symmetrically relative to the center axis. It is to be noted in general that the high dissipated power occurring mains contact and having very rapid heating of the substrate 1 dare not lead to the fracture of the usually ceramic substrate 1. The substrate 1, in other words, must withstand the occurring dissipated power at least until the PTC resistor 3 becomes high-impedance and thus limits the occurring power. In order to achieve this, it is standard to distribute this dissipated power over a large area. This is achieved by a meander-like fashioning of the film resistors 2a and 2b as already disclosed in the initially cited utility model.

At the left and right, FIG. 3 respectively shows a resistance meander extending from top to bottom, whereby, for example, the upper end of the left-hand meander forms a first terminal point 11 for the left-hand PTC resistor 3a. The second, right-hand terminal point 12 of the PTC resistor 3a shown at the left is conducted without meander perpendicularly down to the terminal pin 7 of the hybrid circuit, whereas the terminal pin 6 serves as second terminal of the left-hand current path 2a. The illustrated arrangement of the film resistors 2a assures a relatively uniform heating of the substrate 1, i.e. no so-called hot spots occur. Tests have shown that a heating of the substrate 1 to 150° C. was already achieved after approximately five seconds given mains contact dependent on the location at which the mains contact occurred. Since PTC resistors having a switching threshold of approximately 130° C. and up are commercially obtainable, it is not necessary to produce hot spots and position the PTC resistors thereat in order to assure an adequate heating. Switching times of the PTC resistor 3 of approximately two seconds can be achieved without further ado.

The fashioning of the resistance layer with two current paths 2a and 2b respectively having two terminal pins 6, 7 or, respectively, 8, 9 and a PTC resistor 3a, 3b respectively connected in series to the film resistors 2a, 2b of the respective current path shown in FIG. 3 is a result of the A and B lines standard in telecommunications applications, these being provided for the two speaking directions. There is thereby the general demand, for example in order to decouple the two speaking directions, that the relative impedance of the voice branches relative to one another dare comprise a tolerance of only approximately ±0.6%. This cannot be achieved without further ado in conjunction with the PTC resistors 3a, 3b, which normally have a resistance tolerance of approximately 20% and taking the tolerance scatters of ±15% of the meander resistors connected in series with the PTC resistor (after printing and being burned in). However, the PTC resistors can already be supplied in pairs with a relative tolerance of only ±5%. Inventively, it is then very advantageous when the resistance layer 2a, 2b is fashioned meandered in every current path with a plurality of shorted meander loops 13—see FIG. 3—, so that the overall resistance of the two current paths relative to one another can be balanced by measurement to a tolerance of approximately ±0.6% by parting an adequate plurality of shorted meander loops 13. By parting the shorts 14, thus, the nominal value of the overall resistance composed of PTC resistor 3a, 3b and film resistors 2a, 2b is achieved. The meander resistances 2a, 2b, moreover, are arranged such that a large-area and uniform distribution of the dissipated power is also assured given unparted webs 14 (resistance pressure at the upper fabrication tolerance).

What is claimed is:

1. A hybrid circuit arrangement having a resistance layer applied at least on one side of a plate-shaped substrate of a material selected from the group consisting of glass and ceramic, and having at least one overload protection arranged on the substrate that is electrically connected to the resistance layer and that is formed by a surface-mounted PTC resistor, the improvements comprising at opposite surfaces, the PTC resistor having two contact surfaces proceeding parallel to the substrate, each of said surfaces being connected to the resistance layer by an angled-off contact lug so that the PTC resistor is arranged spaced from the substrate by the angled-off contact lugs and becomes high-impedance due to the intrinsic heating occurring in case of an overload, said resistance layer having two current paths with each path having two terminal pines and a PTC resistor connected in series with the film resistors of the current path; and the resistance layer in each current path being fashioned with meanders with a plurality of shorted meander loops so that the overall resistance of the two current paths is balanced to a tolerance of approximately ±0.6% relative to one another by parting an adequate plurality of shorted meander loops.

* * * * *